US011234340B2

(12) United States Patent
Bailey et al.

(10) Patent No.: US 11,234,340 B2
(45) Date of Patent: Jan. 25, 2022

(54) MODULAR DATA CENTER POWER DISTRIBUTION SYSTEM

(71) Applicant: DELL PRODUCTS, L.P., Round Rock, TX (US)

(72) Inventors: Mark M. Bailey, Round Rock, TX (US); Colin Mahaffey, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/653,971

(22) Filed: Oct. 15, 2019

(65) Prior Publication Data

US 2021/0112677 A1 Apr. 15, 2021

(51) Int. Cl.
*H05K 7/14* (2006.01)

(52) U.S. Cl.
CPC .................. *H05K 7/1492* (2013.01)

(58) Field of Classification Search
CPC ..... H05K 7/1492; H05K 7/1457; G06F 1/189
See application file for complete search history.

(56) References Cited

U.S. PATENT DOCUMENTS

| | | | | |
|---|---|---|---|---|
| 7,672,590 B2* | 3/2010 | Niedrich | ................. | G06F 1/189 398/66 |
| 7,852,627 B2 | 12/2010 | Schmitt et al. | | |
| 8,077,455 B2* | 12/2011 | Jian | ........................ | G06F 1/181 361/679.48 |
| 9,320,166 B1* | 4/2016 | Marr | ....................... | G06F 1/263 |
| 9,400,726 B2 | 7/2016 | Nicholson et al. | | |
| 10,039,207 B2 | 7/2018 | Schmitt et al. | | |
| 10,082,857 B1 | 9/2018 | Czamara et al. | | |
| 10,582,635 B1* | 3/2020 | Ross | .................... | H05K 7/1497 |
| 2007/0046103 A1* | 3/2007 | Belady | ..................... | H02G 3/00 307/12 |
| 2016/0066471 A1 | 3/2016 | Zhang et al. | | |
| 2018/0373548 A1 | 12/2018 | Nassoura | | |

* cited by examiner

*Primary Examiner* — Mukundbhai G Patel
(74) *Attorney, Agent, or Firm* — Isidore PLLC

(57) ABSTRACT

A modular data center (MDC) has an MDC power distribution system (PDS) that includes a power distribution module attached to a top or bottom of the interior enclosure of a volumetric container of the MDC. The power distribution module is electrically coupled to an external power source to receive electrical power and comprising electrical sockets that distribute the received electrical power from an electrical power source external to the volumetric container. Electrical cord(s) have a respective electrical plug insertable in a respective electrical socket of the power distribution module and having another end that is electrically connectable to a rack power distribution unit (PDU). Rack information handling system(s) is positioned in an interior enclosure of a volumetric container of the MDC and has information technology (IT) component(s) mounted to the rack. The rack PDU is attached to the rack and electrically coupled to distribute electrical power to the IT component(s).

16 Claims, 10 Drawing Sheets

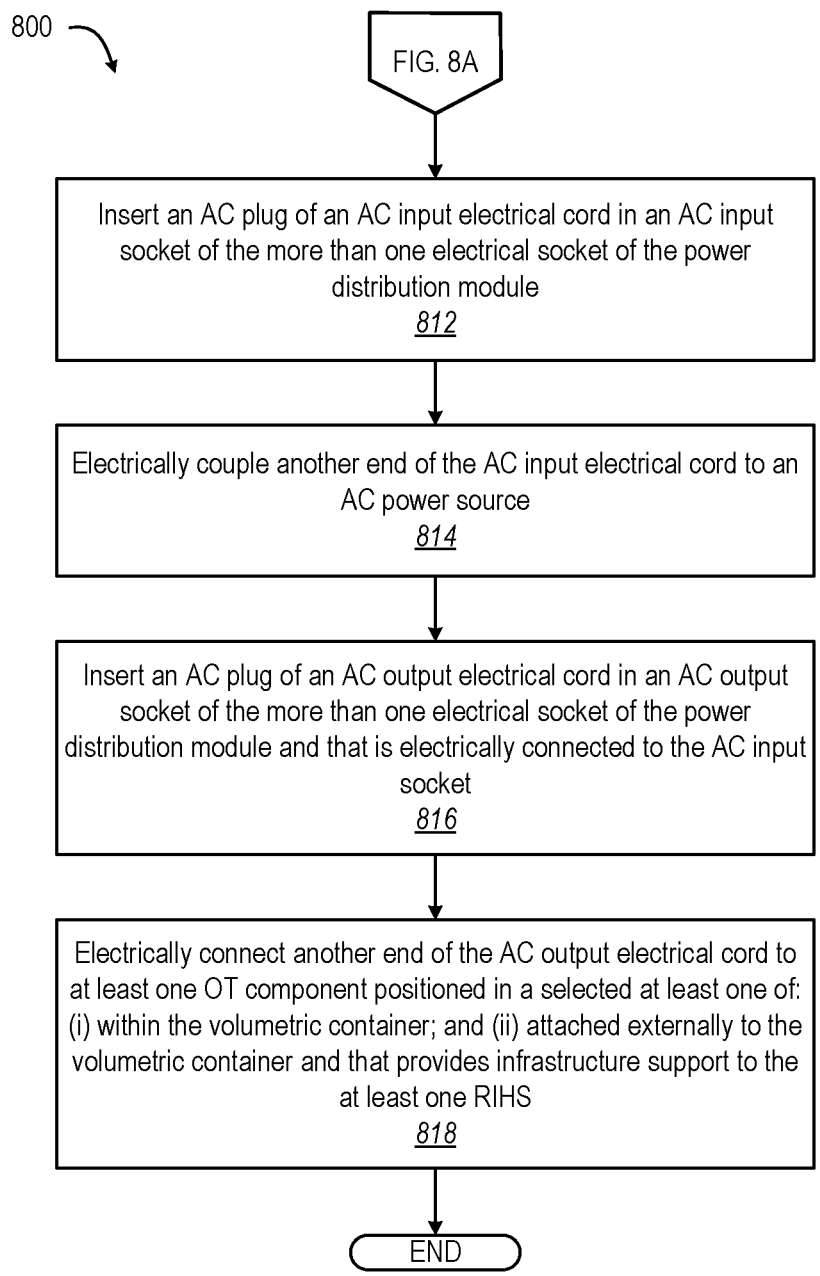

MODULAR DATA CENTER POWER DISTRIBUTION SYSTEM

BACKGROUND

1. Technical Field

The present disclosure relates in general to a modular data center (MDC), and more particularly to distributing power in an MDC.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A data center houses IHSs and associated components, such as telecommunications and storage systems. A modular data center (MDC) is a deployable data center. An MDC can be placed anywhere data capacity is needed. MDC systems consist of purpose-engineered modules and components that offer scalable data center capacity with multiple power and cooling options. Modular edge data centers (MEDCs) are generally smaller MDC facilities that extend the edge of the network to deliver cloud computing resources and cached streaming content to local end users. MEDCs that have only one or two racks for IT are also referred to as micro MDCs. Minimizing a footprint of an MEDC, and especially for a micro MDC, enables use in space-constrained applications. Electrical power distribution systems of conventional designs of MDCs are generally provided in an electrical panel attached to a lateral side of a volumetric container of the MDC, increasing the footprint of the MDC. The panel has to withstand all of the environmental challenges. Room around the electrical panel have to be unobstructed so that a specially trained electrician can install and service the electrical panel.

BRIEF SUMMARY

In accordance with the teachings of the present disclosure, a modular data center (MDC) has a volumetric container that includes an interior enclosure. At least one rack information handling system (RIHS) is provided within the MDC and includes: (i) a rack positioned in the interior enclosure of the volumetric container; (ii) at least one information technology (IT) component mounted to the rack; and (iii) a rack power distribution unit (PDU) attached to the rack and electrically coupled to distribute electrical power to the at least one IT component. The MDC includes an MDC power distribution system (PDS) having a power distribution module that is attached to a selected one of: (i) a top of the interior enclosure; and (ii) a bottom of the interior enclosure of the volumetric container. The power distribution module is electrically coupled to receive electrical power from an external power source. The power distribution module includes more than one electrical socket attached to a housing. The housing and the more than one electrical socket of the power distribution module provide electrical isolation to personnel during installation and operation of the MDS PDS. An electrical plug terminating from an electrical cord is insertable without tools in a respective electrical socket of the more than one electrical socket of the power distribution module. The electrical cord has another end that is electrically connectable to the rack PDU. Attaching the power distribution module to either the top or the bottom of the interior enclosure enables a narrower width of the volumetric container.

In accordance with another aspect of the present disclosure, an MDC PDS includes a power distribution module that is attached to a selected one of: (i) a top of an interior enclosure of a volumetric container of an MDC; and (ii) a bottom of the interior enclosure. The power distribution module is electrically coupled to receive electrical power from an external power source. The power distribution module has more than one electrical socket attached to a housing. The housing and the more than one electrical socket of the power distribution module provide electrical isolation to personnel during installation and operation of the MDS PDS. MDS PDS includes an electrical cord having an electrical plug insertable without tools in an electrical socket of the more than one electrical socket of the power distribution module. The electrical cord has another end that is electrically connectable to a PDU of a RIHS that is positioned in the interior enclosure. The RIHS includes: (i) a rack positioned in the volumetric container; (ii) at least one information technology (IT) component mounted to the rack; and (iii) the rack PDU attached to the rack and electrically coupled to distribute electrical power to the at least one IT component. Attaching the power distribution module to either the top or the bottom of the interior enclosure enables a narrower width of the volumetric container.

In accordance with an additional aspect of the present disclosure, a method is disclosed for providing electrical power to at least one RIHS within an MDC, without requiring a large electrical footprint. The method includes attaching a power distribution module to a selected one of: (i) a top of an interior enclosure of a volumetric container of the MDC; and (ii) a bottom of the interior enclosure. The power distribution module has more than one electrical socket attached to a housing. The housing and the more than one electrical socket of the power distribution module provide electrical isolation to personnel during installation and operation of the MDD PDS. The method includes electrically coupling the power distribution module to an electrical power source external to the volumetric container. The method includes inserting, without tools, an electrical plug of at electrical cord in an electrical socket of the more than one electrical socket of the power distribution module. The method includes electrically connecting another end of the electrical cord to a rack PDU. The at least one RIHS is positioned in the interior enclosure and comprises: (i) a rack positioned in the volumetric container; (ii) at least one information technology (IT) component mounted to the rack; and (iii) the rack PDU attached to the rack and electrically coupled to distribute electrical power to the at least one IT component. Attaching the power distribution module to either the top or the bottom of the interior enclosure enables a narrower width of the volumetric container.

The above presents a general summary of several aspects of the disclosure to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIGS. 8A-8B present a flow diagram of a method for equipping an MDC with an MDC PDS, without requiring a large footprint, according to one embodiment.

DETAILED DESCRIPTION

Figure 1A:
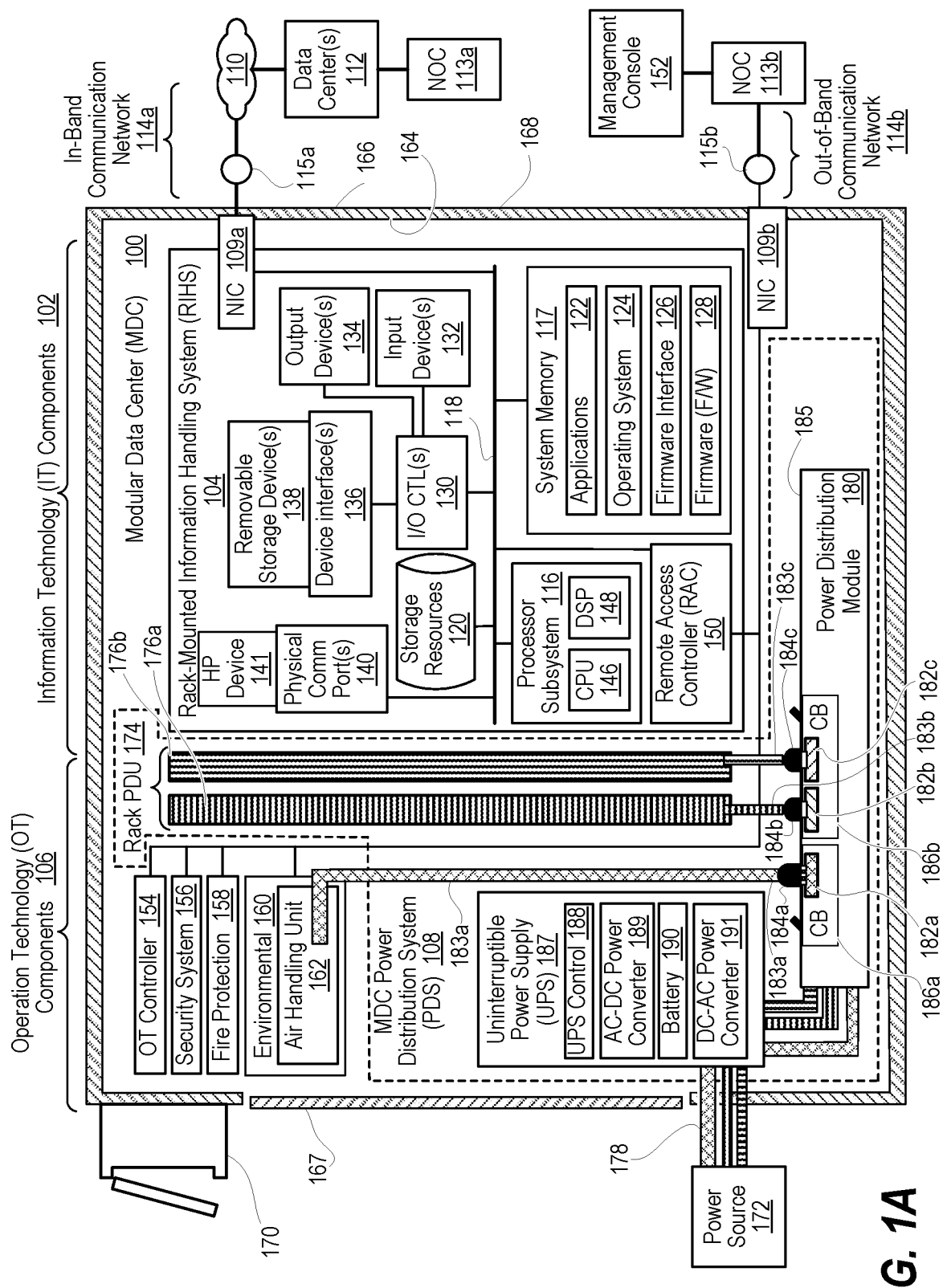
FIG. 1A is a block diagram of a modular data center (MDC) that has a power distribution system (PDS) that enables a smaller footprint of the MDC and simplified installation of PDS components, according to one or more embodiments.

According to aspects of the present disclosure, a modular data center (MDC), an MDC power distribution system (PDS) of the MDC, and method provide an MDC with a reduced footprint and installation that is more economical than a conventional MDC with an external PDS requiring a much larger footprint. The MDS PDS includes a power distribution module that is attached to a top or bottom of the interior enclosure of a volumetric container of the MDC. The interior placement of the power distribution modules enables the MDC to have narrower width and reduced footprint. The power distribution module is electrically coupled to an electrical conductor(s) to receive electrical power from an electrical power source external to the volumetric container. The power distribution module includes electrical sockets that distribute the received electrical power. At least one internal electrical cord(s) has a respective electrical plug insertable in a respective electrical socket of the power distribution module, with the other end of the cord electrically connectable to a rack power distribution unit (rPDU). Use of the sockets and plugs enable installation of a power connection for the rPDU without special tools or electrician training. One or more Information Technology (IT) racks are positioned in an interior enclosure of a volumetric container of the MDC and has IT component(s), such as rack information handling system(s) (RIHS(s)), mounted to/in the rack. The rack PDU is attached to the rack and electrically coupled to distribute electrical power to the IT component(s).

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1A is a simplified functional block diagram of modular data center (MDC) 100 having IT components 102, such as rack information handling systems (RIHSs) 104, that receive infrastructure support by operation technology (OT) components 106, including MDC power distribution system (PDS) 108. Within the general context of IHSs, RIHS 104 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, RIHS 104 may be a personal digital assistant (PDA), a consumer electronic device, a network storage device, or any other suitable device and may vary in size, shape, performance, functionality, and price. The information handling system may include random access memory (RAM), one or more processing resources such as a central processing unit (CPU) or hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. RIHS 104 may also include one or more buses operable to transmit communications between the various hardware components. In one or more embodiments, RIHS 104 is rack-mounted to provide computing, communication and storage functionality in MDC 100.

RIHS 104 includes a network interface, depicted as network interface controller (NIC) 109*a*, in communication via network 110 for communicating with cloud-based data center(s) 112. Management of cloud-based data center(s) 112 is provided by network operations center (NOC) 113*a*. NIC 109*a* enables RIHS 104 and/or components within RIHS 104 to communicate and/or interface with other devices, services, and components that are located external to RIHS 104. These devices, services, and components can interface with RIHS 104 via an external network, such as network 110, using one or more communication protocols that include transport control protocol (TCP/IP) and network block device (NBD) protocol. Network 110 can be a local area network, wide area network, personal area network, and the like, and the connection to and/or between network 110 and RIHS 104 can be wired, wireless, or a combination thereof. For purposes of discussion, network 110 is indicated as a single collective component for simplicity. However, it should be appreciated that network 110 can comprise one or more direct connections to other devices as well as a more complex set of interconnections as can exist within a local area network or a wide area network, such as the Internet. In one or more embodiments, NIC 109*a* supports in-band communication network 114*a* via connection 115*a* that transfers workload and computer data between IT components 102 and cloud-based data center(s) 112.

Processor subsystem 116 is coupled to system memory 117 via system interconnect 118. System interconnect 118 can be interchangeably referred to as a system bus, in one or more embodiments. System interconnect 118 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 118 can also be a Double Data Rate (DDR) memory interface. The system memory 117 can either be contained on separate, removable dual inline memory module (RDIMM) devices or system memory 117 can be contained within persistent memory devices (NVDIMMs). For example, the NVDIMM-N variety of NVDIMMs contain both random access memory, which can serve as system memory 117, and non-volatile memory. It should be noted that other channels of communication can be contained within system interconnect 118, including but not limited to i2c or system management bus (SMBus). System interconnect 118 communicatively couples various system components. Examples of system components include replaceable local storage resources 120 such as solid-state drives (SDDs) and hard disk drives (HDDs). Software and/or firmware modules and one or more sets of data that can be stored on local storage resources 120 and be utilized during operations of RIFTS 104. Specifically, in one embodiment, system memory 117 can include therein a plurality of such modules, including one or more of application(s) 122, operating system (OS) 124, a firmware interface 126 such as basic input/output system (BIOS) or Uniform Extensible Firmware Interface (UEFI), and platform firmware (FW) 128. These software and/or firmware modules have varying functionality when their corresponding program code is executed by processor subsystem 116 or secondary processing devices within RIHS 104. For example, application(s) 122 may include a word processing application, a presentation application, and a management station application, among other applications.

RIHS 104 further includes one or more input/output (I/O) controllers 130 that support connection by and processing of signals from one or more connected input device(s) 132, such as a keyboard, mouse, touch screen, or microphone. I/O controllers 130 also support connection to and forwarding of output signals to one or more connected output devices 134, such as a monitor or display device or audio speaker(s). Additionally, in one or more embodiments, one or more device interfaces 136, such as an optical reader, a universal serial bus (USB), a card reader, Personal Computer Memory Card International Association (PCMCIA) slot, and/or a high-definition multimedia interface (HDMI), can be associated with RIHS 104. Device interface(s) 136 can be utilized to enable data to be read from or stored to corresponding removable storage device(s) 138, such as a compact disk (CD), digital video disk (DVD), flash drive, or flash memory card. In one or more embodiments, device interface(s) 136 can further include general purpose I/O interfaces such as inter-integrated circuit ($I^2C$), system management bus (SMB), and peripheral component interconnect (PCI) buses. Physical communication port(s) 140 that are communicatively coupled to system interlink 118 enable equipping RIHS 104 with other devices. Hot pluggable (HP) device 141 is engaged to physical communication port 140. Hot pluggable device 141 is a selected one of: (i) a storage device containing at least one of: (a) computer program code; (b) computer data; and (c) digital media; and (ii) an encryption key device.

Processor subsystem 116 can include at least one central processing unit (CPU) 146 that is augmented by digital signal processor (DSP) 148. Processor subsystem 116 interfaces to functional components of the RIHS 104 such as a baseboard management controller (BMC). Remote access controller (RAC) 150 performs BMC functionality including (i) monitoring the physical state of a computer, network server or other hardware devices of IT components 102 using sensors and (ii) communicating with a system administrator through an independent connection, such as NIC 109*b*. As a non-limiting example, RAC 150 can be an improved integrated Dell Remote Access Controller (iDRAC) from Dell® that supports in part security operation functionality described herein. The iDRAC has the ability to edit/create files locally to itself. The iDRAC also has the ability to see OS specific files. RAC 150 performs out-of-band communication for the RIHS 104 via NIC 109*b*. In one or more embodiments, NIC 109a supports out-of-band communication network 114b via connection 115b to administrative or management console 152 at NOC 113b.

To manage operations of MDC 100, management console 152 transfers administrative data, administrative settings and upgraded computer code via out-of-band communication network 114b to OT components 106. In one or more embodiments, OT components 106, under control of OT controller 154, provide infrastructure operational support to IT components 102 of MDC 100 including security system 156, fire protection 158, environmental system 160 having air handling unit (AHU) 162, and MDS PDS 108.

In one or more embodiments, MDC 100 is a micro-MDC, having one or two RIHS(s) 104 positioned in interior enclosure 164 of volumetric container 166, which is palletized for mobile delivery. Door(s) 167 provide access to interior enclosure 164 of volumetric container 166. OT components 106 are provisioned in interior enclosure 164 and attached to exterior 168 of volumetric container 166 in external panel(s) 170. For simplicity in describing the functional components of MDC as a collective unit, AHU 162 is depicted as being located within interior enclosure 164. However, it is appreciated that, in most embodiments, AHU 162 is external to volumetric container 166, and AHU 162 may include air redirection structures in interior enclosure 164 to direct cooling air through RIHS 104.

MDC PDS 108 receives power from power source 172 external to volumetric container 166 and distributes the power to IT components 102 of RIHS(s) 104 via rack power distribution unit (PDU) 174 and to OT components 106. Rack PDU 174 includes positive power bar 176a and negative power bar 176b. Each IT component 102 can include electrical contacts or other electrical connections that electrically couple to positive power bar 176a and negative power bar 176b. MDC PDS 108 includes electrical conductor(s) 178 having exterior portions connectable to power source 172 on one end and indirectly electrically coupled at another end to power distribution module 180 via uninterruptible power supply (UPS) 187. Power distribution module 180 is attached to a selected one of: (i) a top of interior enclosure 164; and (ii) a bottom of interior enclosure 164 of volumetric container 166.

Power distribution module 180 includes electrical sockets 182a-c that distribute the received electrical power. For clarity, three electrical sockets 182a-c are depicted. In one or more embodiments, fewer or more electrical sockets are provided. MDC PDS 108 includes internal electrical cords 183a-c that have respective electrical plugs 184a-c insertable without tools in respective electrical sockets 182a-c of power distribution module 180. In the embodiment shown, a terminal end of first internal electrical cord 183a is electrically connected or connectable to AHU 162. Terminal ends of second and third internal electrical cords 183b-c are respectively electrically connected to positive power bar 176a and negative power bar 176b of rack PDU 174. Housing 185 of power distribution module 180 and electrical sockets 182a-c are created using non-conductive material that provides electrical isolation so that personnel inserting electrical plugs 184a-c are protected from electrical shock hazard when assembling at least a portion of MDC PDS 108. Sockets of power distribution modules are configured to house circuit breakers 186a-b. Electrical protection from circuit faults is also provided by circuit breakers 186a-b that can interrupt electrical sockets 182a-c.

In one or more embodiments, power source 172 provides one or both of alternating current (AC) power and direct current (DC) power. UPS 187 that can perform one or more functions in support of distributing AC and/or DC electrical power, including, but not limited to: (i) storing DC power in the event of loss of power from power source 172; (ii) regulating DC power; (iii) converting AC power to DC power; and (iv) converting stored DC power to AC power in the event of loss of AC power from power source 172. UPS 187 includes UPS controller 188, AC-DC power converter 189, battery 190, and DC-AC power converter 191. With AC power available from power source 172, UPS controller 188 enables AC-DC power converter 189 to provide DC power to battery 190 and power distribution module 180. In one or more embodiments as shown, power distribution module 180 receives both AC and DC power directly from UPS 187. UPS controller 188 enables battery 190 to provide DC power directly to power distribution module 180 and to DC-AC power converter 191 to provide AC power to power distribution module 180.

Figure 1B:
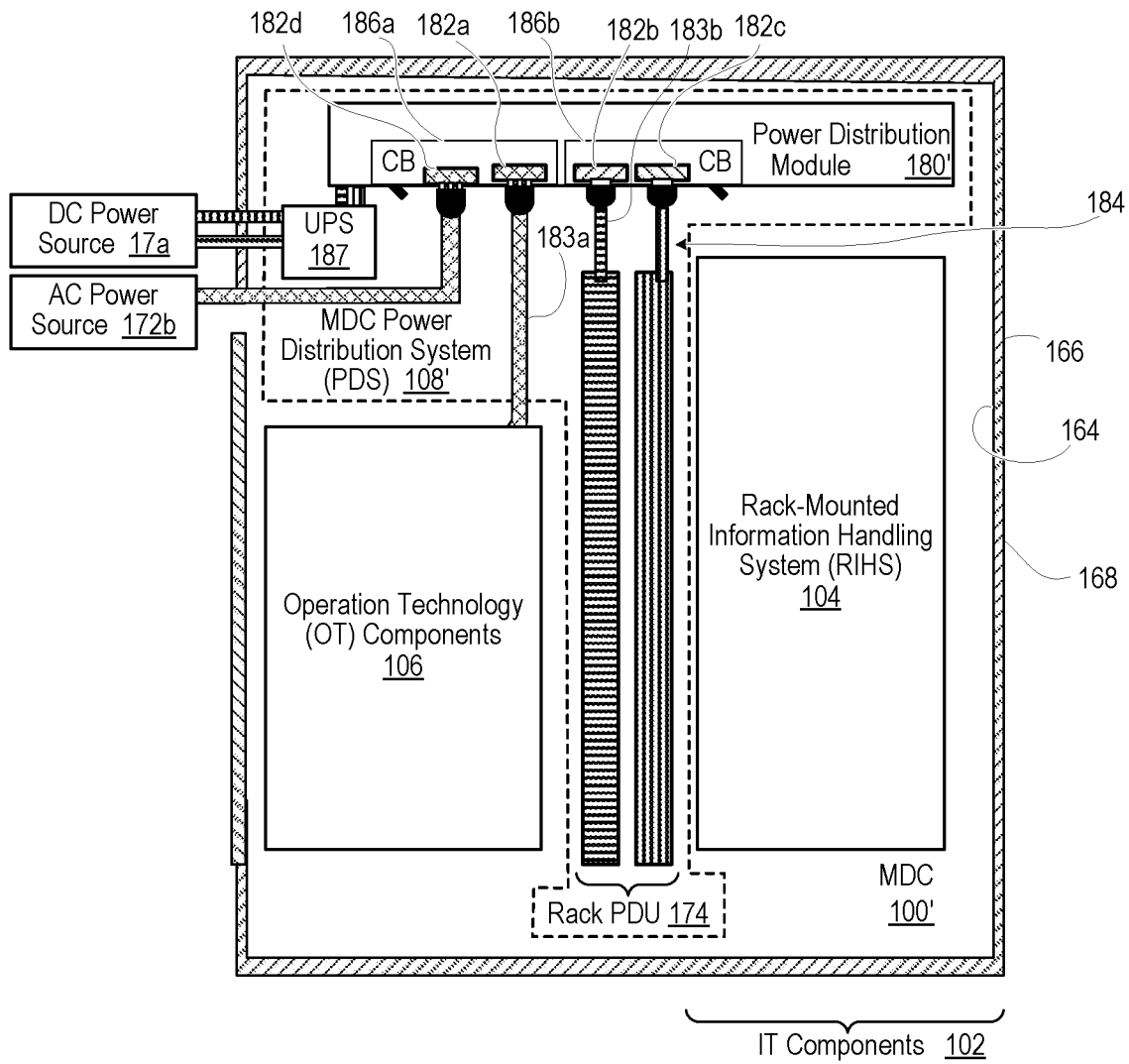
FIG. 1B is a simplified diagram of an MDC with top-mounted power distribution module, according to one or more embodiments.

FIG. 1B is a simplified diagram of MDC 100' with top-mounted power distribution module 180 having electrical cables 184 distributing power to IT and OT components 102, 108. The illustrated embodiment of FIG. 1A provide for an in-floor or bottom attachment of the power distribution module 180, where connection of electrical cables 184 extend upwards from power distribution module 180 towards their respect components and/or rack PDU 174 to which power is being supplied. When, (as illustrated by FIG. 1B), power distribution module 180' is attached to the top or ceiling of the volumetric container 166, connection of electrical cables 184 extend downwards from power distribution module 180 towards their respective components and/or rack PDU 174. Attaching power distribution module 180 to either to the top or the bottom of interior enclosure 164 enables a narrower width of volumetric container 166.

FIG. 1B also illustrates MDS PDS 108' alternate electrical coupling to DC power source 172a and AC power source 172b. DC power source 172a provides DC electrical power to power distribution module 180' via UPS 187. Electrical sockets 182b-c distribute DC power via electrical cables 184b-c to rPDU 174. AC power source 172b provides AC electrical power to power distribution module 180' via AC input electrical cable 193a that is inserted in AC input electrical socket 182d that is electrically connected to AC output electrical socket 182e. Electrical cable 183a is the AC output electrical cable.

Figure 2:
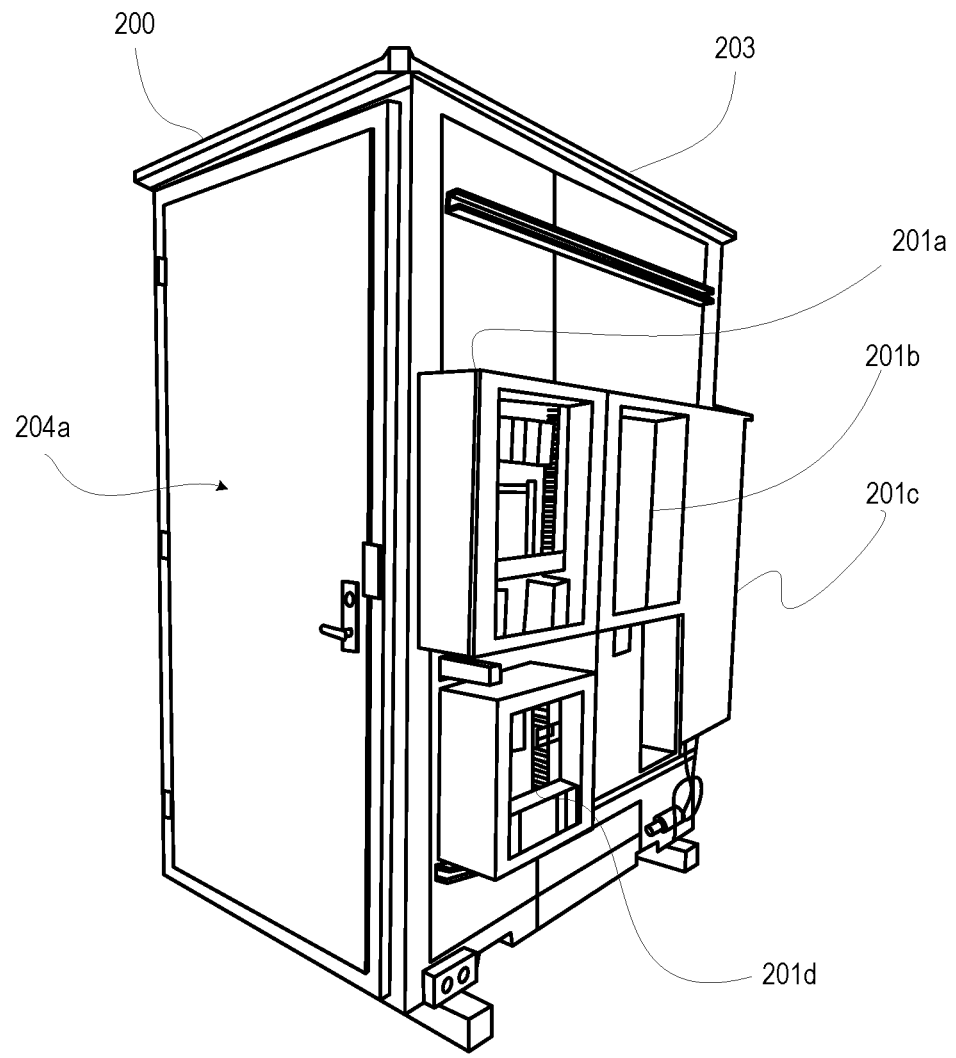
FIG. 2 is a left front perspective view of an example micro-MDC having a volumetric container that fits one or two information technology (IT) racks, according to one or more embodiments.
Figure 3:
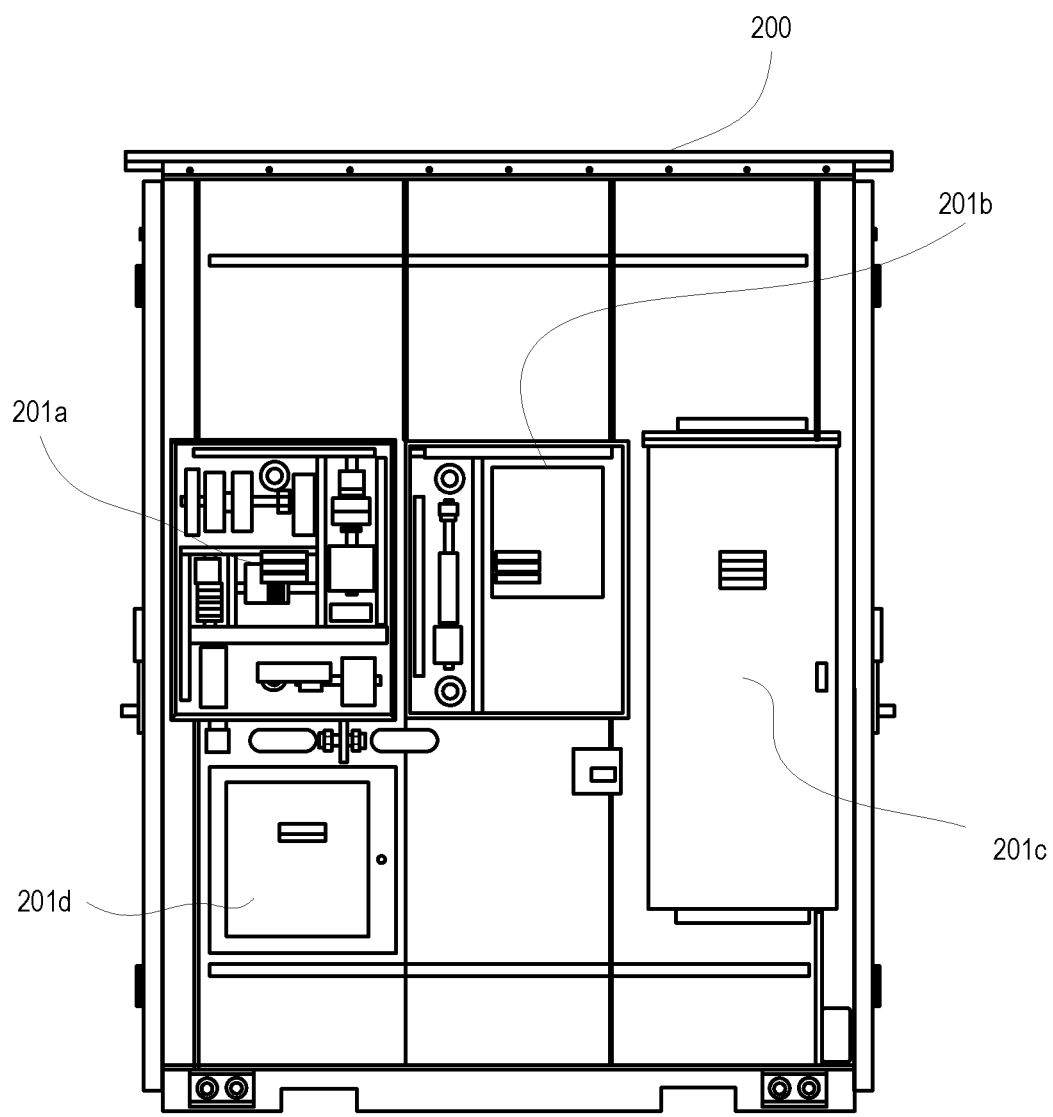
FIG. 3 is a front view of the example micro-MDC, according to one or more embodiments.
Figure 4:
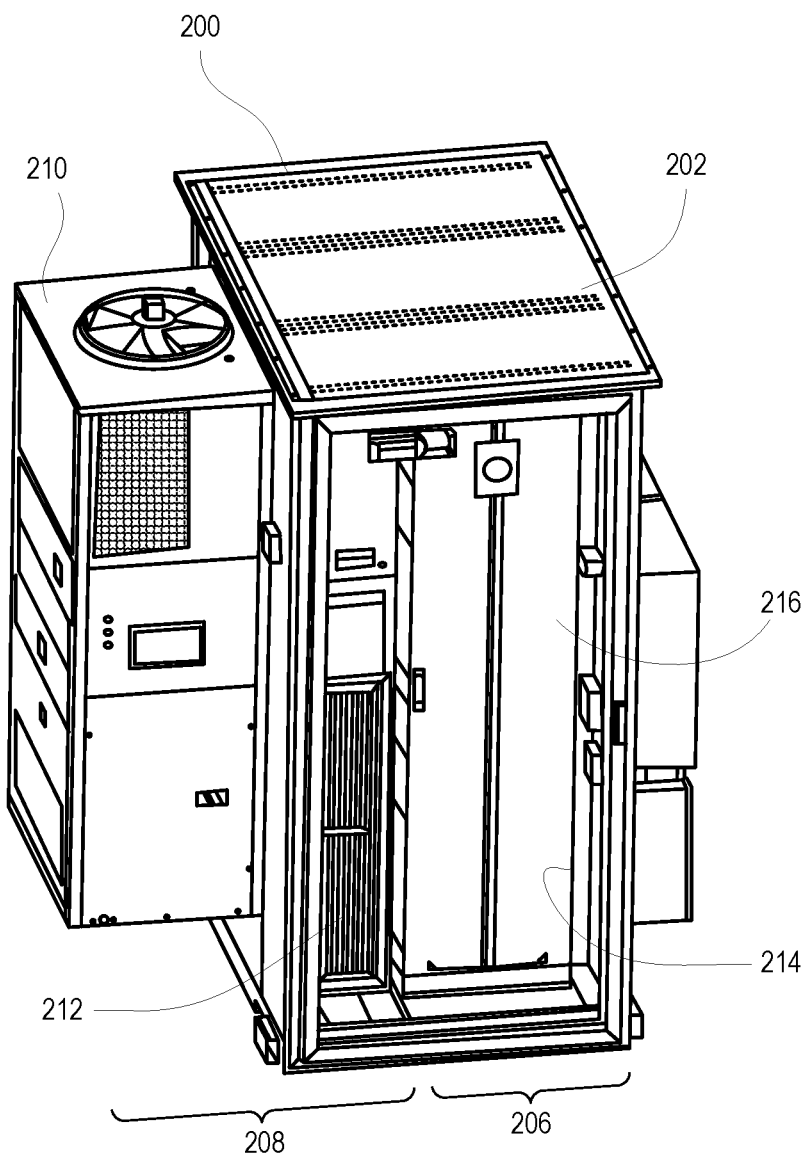
FIG. 4 is a top left perspective view of the example micro-MDC equipped with IT and operation technology (OT) components in one or more IT racks and an attached air handling unit, according to one or more embodiments.
Figure 5:
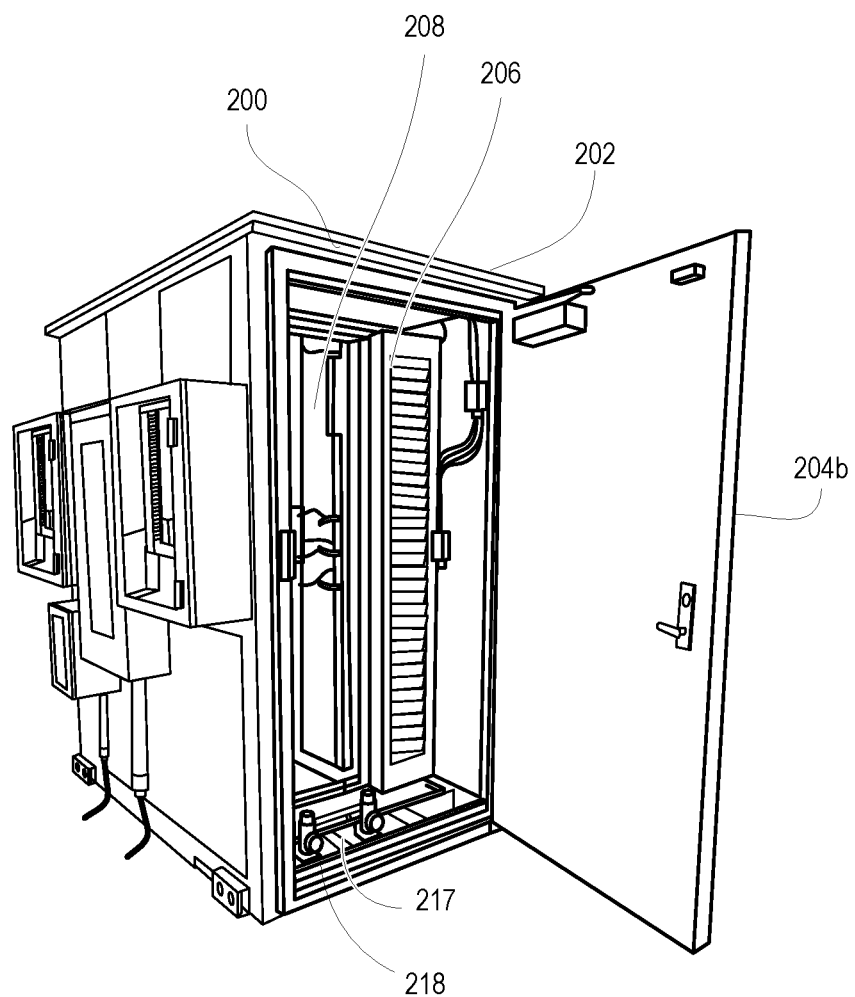
FIG. 5 is a front interior view of the example micro-MDC equipped with an IT rack and an in-floor power distribution module, according to one or more embodiments.

FIG. 2 depicts a side perspective view of an example micro-MDC 200 that is palletized for delivery. micro-MDC 200 can contain at least some of the same or similar functional components described for MDC 100 (FIG. 1A). External enclosures 201a-d provide access, respectively, to controls, security, power, and network. Internal access is provided to enclosure 202 through door 204a. FIG. 3 depicts a front view of the example micro-MDC 200. FIG. 4 depicts a top perspective view of example micro-MDC 200 with door 204 (FIG. 2) removed to expose IT components 206 and OT components 208. OT components 208 include an internal air redirection portion structure 212 of air handling unit 210 (FIG. 4) that is externally mounted to enclosure 202. Air redirection structure 212 within volumetric container 214 of enclosure 202 directs cooling air through RIHS 216 of IT components 206. In one or more embodiments, micro-MDC 200 is configured as a micro MDC with one or two RIHS 216 for use as a modular edge data center (MEDC). FIG. 5 is a front right perspective view of example micro-MDC 200 equipped with IT and OT components 206, 208. Power distribution module 217 of MDC PDS 218 is floor mounted. Internal access of enclosure 202 is through right door 204b.

Figure 6:
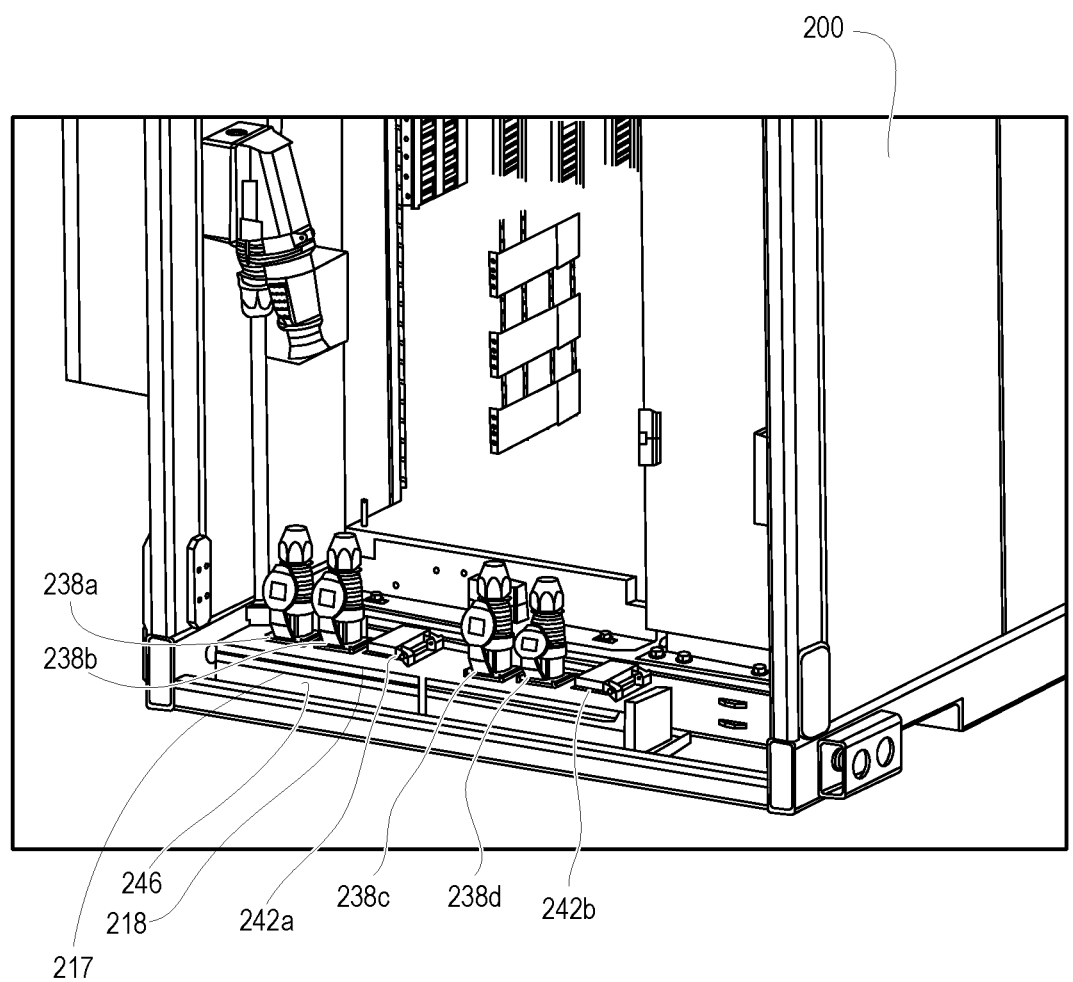
FIG. 6 is a close-up detailed view of the volumetric container equipped with an in-floor power distribution module, according to one or more embodiments.

FIG. 6 is a right-side detail view of example micro-MDC 200 equipped with power distribution module 217 of MDC PDS 218. In the view of FIG. 6, there is no RIHS shown/installed. Floor-mounted power distribution module 217 facilitates distribution of electrical power to IT components within MDC 200. Electrical socket 238a provides positive DC voltage. Electrical socket 238b provides reference DC voltage. Electrical sockets 238a-b are circuit breaker protected. Circuit breaker cover 242a is depicted. Electrical socket 238c provides AC power. Electrical socket 238d receives AC power and is electrically coupled to electrical socket 238c. Electrical sockets 238c-d are circuit breaker protected. Circuit breaker cover 242b is depicted. Display 246 provides status information for each electrical socket 238a-d, circuit breaker 242a-b, and power sources.

In one or more embodiments, circuit breaker protection, or fuse protection, is configurable to match rated requirements of intended use. In one or more embodiments, an inventory of power distribution modules 217 can have different combination of ratings that can be selected for particular uses. Electrical sockets can be keyed so only appropriately rated plugs and cables are used. These features can prevent mismatch in AC and DC connections.

Figure 7:
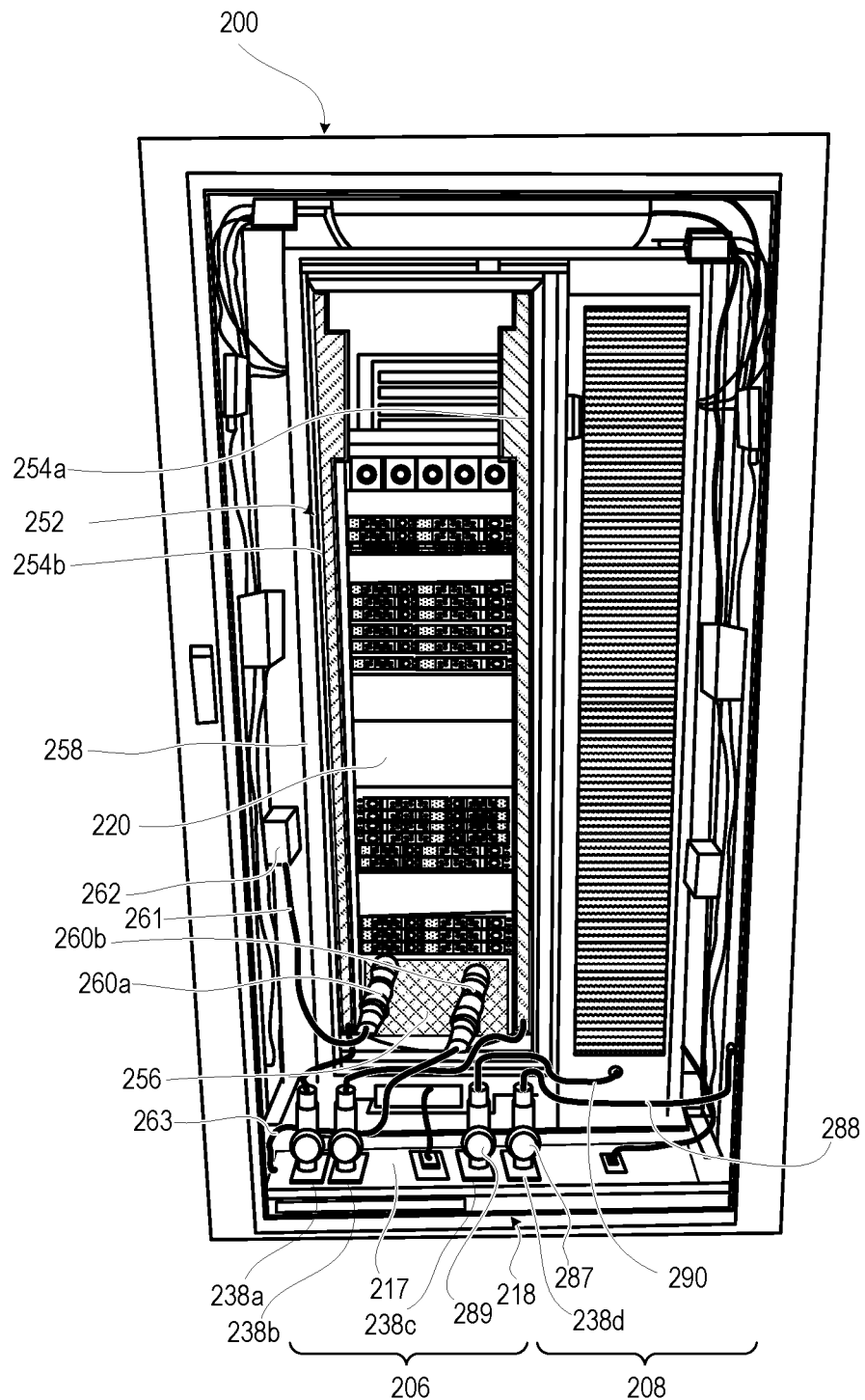
FIG. 7 is a more detailed interior view of the example micro-MDC equipped with an MDC power distribution system (PDS) that delivers power to the IT and OT components via an in-floor power distribution module, according to one or more embodiments.

FIG. 7 is a right-side view of example micro-MDC 200 equipped with RIHS 220 and with MDC PDS 218 that delivers power to the IT components 206 and OT components 208. RIHS 220 includes rack PDU 252 having positive power bar 254a and negative power bar 254b. UPS 256 is mounted in rack 258. UPS 256 has input 260a that receives DC power via cable 261 from connection 262. UPS 256 has output 260b that is electrically connected to power distribution module 217 via cable 263 to deliver DC power. Electrical socket 238a provides positive DC voltage to positive power bar 254a via plug 267 of cable 268. Electrical socket 238b provides reference DC voltage to negative power bar 254b via plug 269 of cable 270. Power distribution module 217 receives AC power from remote power source 172b (FIG. 1B) via plug 287 of cable 288 that is inserted into electrical socket 238d. Power distribution module 217 distributes AC power from electrical socket 238c via plug 289 of cable 290 to air redirection structure 212.

Figure 8A:
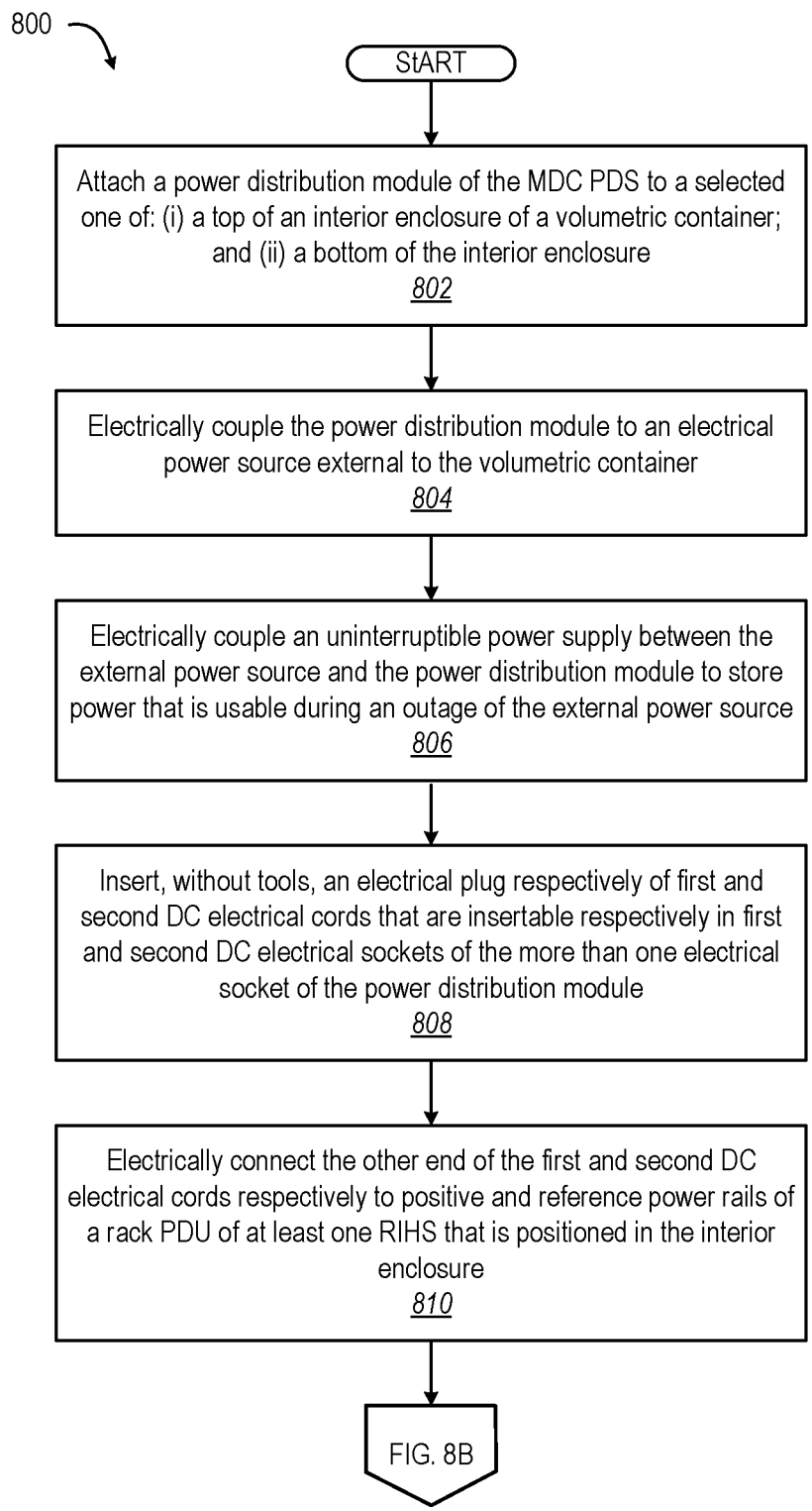

FIGS. 8A-B present a flow diagram of a method for equipping an MDC PDS (108, 218). With reference to FIG. 8A, method 800 includes attaching/mounting a power distribution module of the MDC PDS to a selected one of: (i) a top of an interior enclosure of a volumetric container; and (ii) a bottom of the interior enclosure (block 802). In one or more embodiments, attaching the power distribution module includes positioning the power distribution module within a floor or a ceiling of the volumetric container comprising a micro MDC enclosure sized to fit a selected configuration of: (i) one RIHS; and (ii) two RIHSs. The power distribution module has more than one electrical socket attached to a housing. The housing and the more than one electrical socket of the power distribution module provide electrical isolation to personnel during installation and operation of the MDS PDS. Method 800 includes electrically coupling the power distribution module to an electrical power source external to the volumetric container (block 804). In one or more embodiments, method 800 includes electrically coupling an uninterruptible power supply between the external power source and the power distribution module to store power that is usable during an outage of the external power source (block 806). Method 800 includes inserting, without tools, electrical plugs respectively of first and second DC electrical cords that are insertable respectively in first and second DC electrical sockets of the more than one electrical socket of the power distribution module (block 808). Method 800 includes electrically connecting the other end of the first and second DC electrical cords respectively to positive and reference power rails of a rack PDU of at least one RIHS that is positioned in the interior enclosure (block 810). With reference to FIG. 8B, method 800 includes inserting an AC plug of an AC input electrical cord in an AC input socket of the more than one electrical socket of the power distribution module (block 812). Method 800 includes electrically coupling another end of the AC input electrical cord to an AC power source (block 814). Method 800 includes inserting an AC plug of an AC output electrical cord in an AC output socket of the more than one electrical socket of the power distribution module and that is electrically connected to the AC input socket (block 816). Method 800 includes electrically connecting another end of the AC output electrical cord to at least one OT component positioned in a selected at least one of: (i) within the volumetric container; and (ii) attached externally to the volumetric container and that provides infrastructure support to the at least one RIHS (block 818). Then method 800 ends.

In the above described flow chart of FIG. 8 one or more of the methods may be embodied in an automated assembly system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made, and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A modular data center (MDC) comprising:
   a volumetric container comprising an interior enclosure;
   at least one rack information handling system (RIHS) comprising: (i) a rack positioned in the volumetric container; (ii) at least one information technology (IT) component mounted to the rack; and (iii) a rack power distribution unit (PDU) attached to the rack and electrically coupled to distribute electrical power to the at least one IT component; and
   an MDC power distribution system (PDS) comprising:
      a power distribution module that is attached to a selected one of: (i) a top of the interior enclosure; and (ii) a bottom of the interior enclosure of the volumetric container, the power distribution module electrically coupled to receive electrical power from an external power source, the power distribution module comprising more than one electrical socket attached to a housing, the more than one electrical socket comprising at least one direct current (DC) output socket that provides DC power to a positive power bar via a plug of a DC electrical cable and at least one alternative current (AC) output socket, by which the power distribution module distributes AC power to at least one AC powered component, the AC output socket being in addition to and separate from an AC input socket that connects to an external power source, the housing and the more than one electrical socket of the power distribution module providing electrical isolation to personnel during installation and operation of the MDS PDS; and
      an electrical cord having an electrical plug insertable without tools in an electrical socket of one of the more than one electrical socket of the power distribution module, the electrical cord having another end that is electrically connectable to the rack PDU, wherein attaching the power distribution module to either the top or the bottom of the interior enclosure enables a narrower width of the volumetric container.

2. The MDC of claim 1, wherein:
   the rack PDU comprises positive and reference power rails attached to the rack of the RIHS; and
   the more than one electrical cord comprise first and second DC electrical cords that are insertable respectively in first and second DC electrical sockets of the more than one electrical socket of the power distribution module, the first and second DC electrical cords are electrically connected at an opposite end respectively to the positive and reference power rails of the rack PDU.

3. The MDC of claim 1, further comprising at least one AC-powered operation technology (OT) component positioned in a selected at least one of: (i) within the volumetric container; and (ii) attached externally to the volumetric container and that provides infrastructure support to the at least one RIHS,
   wherein the MDC PDS further comprises:
      an AC input electrical cord that is remotely electrically coupled to an AC power source and has an AC plug;
      the power distribution module comprises: (i) the AC input socket of the more than one electrical socket that receives the AC plug; and (ii) the AC output socket of the more than one electrical socket that is electrically connected to the AC input socket; and
      an AC output electrical cord of the more than one electrical cord and having an electrical plug that is insertable in the AC output socket and having another end that is electrically connectable to the at least one OT component.

4. The MDC of claim 1, wherein the MDC PDS further comprises an uninterruptible power supply that electrically couples the electrical power received from the external power source to the power distribution module.

5. The MDC of claim 1, wherein the volumetric container comprises a micro MDC volumetric container sized to fit a selected configuration of: (i) one rack that contains the at least one mounted IT component; and (ii) two racks that contain the at least one mounted IT component.

6. The MDC of claim 1, wherein the rack PDU comprises a positive power bar and a negative power bar that extends vertically through an interior of the rack to support DC current distribution to IHSs inserted within vertical slots of the rack.

7. A modular data center (MDC) power distribution system (PDS) comprising:
   a power distribution module that is attached to a selected one of: (i) a top of an interior enclosure of a volumetric container of an MDC; and (ii) a bottom of the interior enclosure, the power distribution module electrically coupled to receive electrical power from an external power source, the power distribution module comprising more than one electrical socket attached to a housing, the more than one electrical socket comprising at least one direct current (DC) socket that provides DC power to a positive power bar via a plug of a DC electrical cable and at least one alternative current (AC) socket by which the power distribution module distributes AC power to at least one AC powered component, the AC output socket being in addition to and separate from an AC input socket that connects to an external power source, the housing and the more than one electrical socket of the power distribution module providing electrical isolation to personnel during installation and operation of the MDS PDS; and
   an electrical cord, each electrical cord having an electrical plug insertable without tools in a respective electrical socket of the more than one electrical socket of the power distribution module, the electrical cord having another end that is electrically connectable to a rack power distribution unit (PDU);

wherein at least one rack information handling system (RIHS) is positioned in the interior enclosure and comprises: (i) a rack positioned in the volumetric container; (ii) at least one information technology (IT) component mounted to the rack; and (iii) the rack PDU attached to the rack and electrically coupled to distribute electrical power to the at least one IT component; and wherein attaching the power distribution module to either the top or the bottom of the interior enclosure enables a narrower width of the volumetric container.

8. The MDC PDS of claim 7, wherein the more than one electrical cord comprise first and second DC electrical cords that are insertable respectively in first and second DC electrical sockets of the more than one electrical socket of the power distribution module, the first and second DC electrical cords are electrically connected at an opposite end respectively to positive and reference power rails of the rack PDU.

9. The MDC PDS of claim 7, further comprising,
an AC input electrical cord that is remotely electrically coupled to an AC power source and has an AC plug;
the power distribution module comprises: (i) the AC input socket of the more than one electrical socket that receives the AC plug; and (ii) the AC output socket of the more than one electrical socket that is electrically connected to the AC input socket; and
an AC output electrical cord of the more than one electrical cord and having an electrical plug that is insertable in the AC output socket and having another end that is electrically connectable to at least one operation technology (OT) component positioned in a selected at least one of: (i) within the volumetric container; and (ii) attached externally to the volumetric container and that provides infrastructure support to the at least one RIHS.

10. The MDC PDS of claim 7, further comprising an uninterruptible power supply that electrically couples the electrical power received from the external power source to the power distribution module.

11. The MDC PDS of claim 7, wherein power distribution module is sized to fit in the volumetric container comprising a micro MDC volumetric container sized to fit a selected configuration of: (i) one rack that contains the at least one mounted IT component; and (ii) two racks that contain the at least one mounted IT component.

12. A method for equipping a modular data center (MDC) power distribution system (PDS), the method comprising:
attaching a power distribution module to a selected one of: (i) a top of an interior enclosure of a volumetric container; and (ii) a bottom of the interior enclosure, the power distribution module having more than one electrical socket attached to a housing, the more than one electrical socket comprising at least one direct current (DC) socket that provides DC power to a positive power bar via a plug of a DC electrical cable and at least one alternative current (AC) socket by which the power distribution module distributes AC power to at least one AC powered component, the AC output socket being in addition to and separate from an AC input socket that connects to an external power source, the housing and the more than one electrical socket of the power distribution module providing electrical isolation to personnel during installation and operation of the MDS PDS;
electrically coupling the power distribution module to an electrical power source external to the volumetric container;
inserting, without tools, an electrical plug of an electrical cord in an electrical socket of the more than one electrical socket of the power distribution module; and
electrically connecting another end of the electrical cord to a rack power distribution unit (PDU);
wherein at least one rack information handling system (RIHS) is positioned in the interior enclosure and comprises: (i) a rack positioned in the volumetric container; (ii) at least one information technology (IT) component mounted to the rack; and (iii) the rack PDU attached to the rack and electrically coupled to distribute electrical power to the at least one IT component; and
wherein attaching the power distribution module to either the top or the bottom of the interior enclosure enables a narrower width of the volumetric container.

13. The method of claim 12, wherein:
inserting the electrical plug of the electrical cord in the respective electrical socket comprises inserting the electrical plug respectively of first and second DC electrical cords that are insertable respectively in first and second DC electrical sockets of the more than one electrical socket of the power distribution module; and
electrically connecting the other end of the electrical cord to the rack PDU comprises electrically connecting the other end of the first and second DC electrical cords respectively to positive and reference power rails of the rack PDU.

14. The method of claim 12, further comprising:
inserting an AC plug of an AC input electrical cord in an AC input socket of the more than one electrical socket of the power distribution module;
electrically coupling another end of the AC input electrical cord to an AC power source;
inserting an AC plug of an AC output electrical cord in an AC output socket of the more than one electrical socket of the power distribution module and that is electrically connected to the AC input socket; and
electrically connecting another end of the AC output electrical cord to at least one operation technology (OT) component positioned in a selected at least one of: (i) within the volumetric container; and (ii) attached externally to the volumetric container and that provides infrastructure support to the at least one RIHS.

15. The method of claim 12, further comprising electrically coupling an uninterruptible power supply between the external power source and the power distribution module to store power that is usable during an outage of the external power source.

16. The method of claim 12, wherein attaching the power distribution module comprises positioning the power distribution module within the volumetric container comprising a micro MDC enclosure sized to fit a selected configuration of: (i) one RIHS; and (ii) two RIHSs.

* * * * *